(12) United States Patent
Lyuksyutov et al.

(10) Patent No.: US 7,431,970 B1
(45) Date of Patent: Oct. 7, 2008

(54) METHOD OF POLYMER NANOLITHOGRAPHY

(75) Inventors: Sergei Lyuksyutov, Akron, OH (US); Shane Juhl, Dayton, OH (US); Richard Vaia, Beavercreek, OH (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 764 days.

(21) Appl. No.: 10/817,406

(22) Filed: Mar. 25, 2004

Related U.S. Application Data

(60) Provisional application No. 60/540,903, filed on Jan. 21, 2004.

(51) Int. Cl.
*B05D 5/00* (2006.01)
(52) U.S. Cl. ..................... 427/256; 264/405
(58) Field of Classification Search ............. 216/2; 264/405, 446, 449, 451; 427/256
See application file for complete search history.

(56) References Cited

U.S. PATENT DOCUMENTS

| 5,729,026 A | 3/1998 | Mamin et al. |
| 5,808,302 A | 9/1998 | Binnig et al. |
| 5,856,967 A | 1/1999 | Mamin et al. |
| 6,249,747 B1 | 6/2001 | Binnig et al. |
| 6,391,217 B2 | 5/2002 | Schaffer et al. |

OTHER PUBLICATIONS

Sergei F. Lyuksyutov et al. "Electrostatic Nanolithography in Polymers Using Atomic Force Microscopy" Published online, Jun. 22, 2003.*

* cited by examiner

*Primary Examiner*—Roberts Culbert
(74) *Attorney, Agent, or Firm*—AFMCLO/JAZ; Richard A. Lambert

(57) ABSTRACT

An atomic force microscopy polymer nanolithography method is described. The method of the present invention enables rapid creation of raised or depressed features in a polymer film. The features are generated by mass transport of polymer within an initially uniform, planar film via localized softening of attoliters of polymer by Joule heating. This localized softening of the polymer is accomplished by current flow between the AFM tip and a conductive wafer upon which the layer of polymer is mounted.

8 Claims, 1 Drawing Sheet

METHOD OF POLYMER NANOLITHOGRAPHY

CROSS REFERENCE TO RELATED APPLICATIONS

The present application is related to and claims priority on prior provisional Application No. 60/540,903, filed Jan. 21, 2004, entitled Method of Polymer Nanolithography

RIGHTS OF THE GOVERNMENT

The invention described herein may be manufactured and used by or for the Government of the United States for all governmental purposes without the payment of any royalty.

BACKGROUND OF THE INVENTION

The present invention relates generally to nanolithography and specifically to a polymer electrostatic nanolithography method using Atomic Force Microscopy.

The use of nano and micro-scale structuring of polymers, whether as a sacrificial, pattern-transfer layer or as the active component in a nano-device, is integral to nearly every aspect of future material fabrication. Two general areas of interest are polymer patterning for micro/nanofabrication and ultra dense data storage. Ultra compact data storage in thin polymer films is a promising alternative to sometimes unreliable ferromagnetic storage mediums such as computer floppy disks and the like.

Recent nanolithography investigations to date are based on the spatially selective removal or deposition of polymer. While somewhat successful, the prior art techniques are generally slow to perform. These techniques generally require chemical cross-linking, and/or substantial polymer degradation or ablation to effect. This permanently changes the composition and structure of the media itself, rendering it ineffective for repetitive data storage and retrieval applications.

A recent polymer nanolithography technique is described in U.S. Pat. No. 6,249,747 to Binning et al. The Binning device utilizes a cantilevered tip within an Atomic Force Microscope wherein an electrically conductive material is attached to the tip. In use, an electric current is applied to the electrically conductive material, creating heat within the tip. The tip, thus heated, is selectively applied to a heat deformable film to create pits. The pits are utilized to convey information by the creation of a coherent structure. This information is binary (pits, smooth surface). While this technique is somewhat effective, it has the disadvantage that a specialized tip is required and the application of current to heat the tip slows the overall lithographic process.

A need exists therefore for a high speed polymer nanolithography method that facilitates rapid polymer feature creation without polymer degradation, cross-linking or removal. Such a method would enable reliable, high speed feature creation, and additionally provide for a ready erasure process and subsequent re-patterning of the polymer film. Such a method would desirably impart additional information beyond binary by the creation of raised areas in addition to pits and smooth surface.

SUMMARY OF THE INVENTION

Accordingly, it is a primary object of the present invention to provide a polymer nanolithography method overcoming the limitations and disadvantages of the prior art.

Another object of the present invention is to provide a polymer nanolithography method using conventional Atomic Force Microscopy (AFM) apparatuses and techniques.

Yet another object of the present invention is to provide a polymer nanolithography method providing rapid creation of raised or depressed features upon a polymer film.

It is still another object of the present invention to provide a polymer nanolithography method providing rapid creation of raised or depressed features without external heating of a polymer film or AFM tip-film contact.

These and other objects of the invention will become apparent as the description of the representative embodiments proceeds.

In accordance with the foregoing principles and objects of the invention, a polymer nanolithography method providing rapid creation of raised or depressed features in a polymer film is described. The nanolithography method of the present invention generates features by mass transport of polymer within an initially uniform, planar film via localized softening of attoliters ($10^2$-$10^5$ $nm^3$) of polymer by Joule heating. Advantageously, the feature creation enabled by the method of the present invention facilitates ternary encoding of the film (0, 1, −1) by selectively creating no patterning, raised features or depressed features. This dramatically enhances the information imparted to the film over the binary techniques of the prior art, and enables extremely high data densities.

The localized softening of the polymer is accomplished by current flow between the cantilever AFM tip and a conductive wafer upon which the layer of polymer is grown or mounted. This current flow between the tip and the conductive wafer instills a strong electric field within the polymer which can be readily manipulated to form raised or depressed features within the polymer film. Advantageously, the combination of extremely non-uniform electric field gradients to polarize and manipulate the softened polymer and single-step process methodology using conventional AFM equipment, facilitates rapid (less than one microsecond) creation of raised or depressed features without external heating of a polymer-film or AFM tip-film contact. Additionally, the method of the present invention does not affect or remove the polymer material itself. The polymer can be readily returned to its pre-patterned state by a simple annealing process. This facilitates unlimited feature creation/erasure patterning cycles, rendering our invention amenable to repetitive processes such as data storage/retrieval applications.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1A:
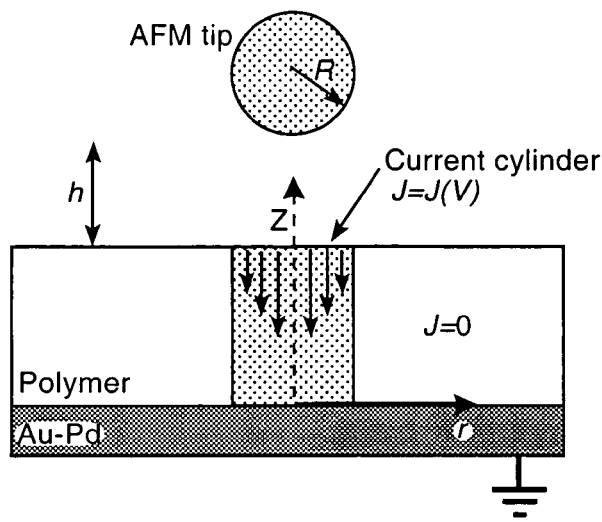
FIGS. 1a, 1b and 1c are diagrammatic representations of feature creation within the polymer film according to the teachings of the present invention.

Reference is made to the drawing figures diagrammatically illustrating the polymer nanolithography method of the present invention. Advantageously, the method of the present invention utilizes conventional Atomic Force Microscopy (AFM) equipment and techniques of operation.

Generally, conventional AFM techniques utilize a selectively positionable, flexible cantilever tip of very small size within an atomic force microscope that is moved relative to a surface to investigate and scan the surface. According to the method of the present invention, a highly conductive cantilever tip is utilized to effect the desired nanolithography. As will be described in more detail below, the nanolithography method of the present invention generates features by mass transport of polymer within an initially uniform, planar film via localized softening of attoliters ($10^2$-$10^5$ nm$^3$) of polymer by Joule heating. Advantageously, the features created according to the method of the present invention are exceedingly small, in the order of nanometers, enabling the storage and retrieval of enormous amounts of information within a very small area. This feature creation is accomplished without polymer cross-linking or removal as typify the techniques of the prior art. The features formed by our invention can be easily removed by annealing the polymer again and again. That is, heating the material in the absence of an electric field, will cause it to soften and allow surface tension to smooth or erase the features earlier created. This renders our invention amenable to repetitive data storage storage and retrieval operations such as found, for example, in the computing art.

The localized softening of the polymer is accomplished by current flow between the cantilever AFM tip and a conductive wafer upon which the layer of polymer is deposited, grown or mounted. This current flow between the tip and the conductive wafer instills a strong electric field within the polymer which can be manipulated to form raised or depressed features within the polymer film. The term polymer is used herein according to its ordinary meaning, referring to chain like molecules made up of large numbers of monomers. In common usage the term "polymer" is associated with plastics, but "polymers" can encompass many other types of materials such as biological and inorganic molecules. That is our intention since the method of the present invention has been successfully demonstrated on disparate types of polymers such as polystyrene, polymethylmethacrylate, DNA and the protein shells of viruses.

Advantageously, the method of the present invention has utility in a wide variety of applications such as enabling the exploration of materials at the atomic and molecular levels and providing the ability to sculpt and assemble structures on the nanoscale. Nano-structuring of polymers is crucial to many aspects of future material fabrication because of the emerging predominance of polymers in commercial and military applications such as molecular electronics, data storage, optoelectronics, displays, and sensors.

The method of the present invention generates features by directed-mass transport of polymer material within an initially uniform, planar film. It is an advantage of the invention that the features are formed without chemical cross-linking, substantial polymer degradation, or ablation. A controlled bias through the thin polymer film (20-100 nm thickness) between the highly conductive cantilever tip and the conductive wafer underneath softens the polymer material directly under the AFM tip through localized Joule heating. The initial tip-surface distance h (FIG. 1a) is set by applying a voltage to the tip such that no mechanical deformation of the polymer film surface occurs during scanning. Features are then generated in the film when the softened polymer is polarized and electrostatically attracted toward the AFM tip by the highly nonuniform electric field ($10^8$-$10^{10}$ Vm). Since the polymer does not deteriorate during the formation of the feature, a subsequent application of heat will soften the entire film, enabling surface tension to erase the feature and re-construct the initially uniform film. Since the polymer itself is not affected, this feature creation/erasure process can be repeated over and over again substantially without limitation. It has been determined that maintaining a relative humidity level within the atomic force microscope between about 10 at about 70 percent provides the best results.

According to the method of the present invention, three distinct features (0, 1, −1); no patterning, raised structures and depressions respectively can be created in the polymer depending on the applied voltage, or alternatively electrical current. This ternary encoding dramatically increases the information that can be written into the film over the binary techniques of the prior art. The absolute value of the threshold separating these regions depends on writing conditions, polymer composition and film thickness. For example, a thin film (thickness=40 nm, surface roughness 0.5-1 nm) of polystyrene was spin cast (1 wt % solution in toluene) onto a sputter deposited Au—Pd film on a silicon wafer. The film was annealed above the glass transition temperature ($T_g$) in vacuum to remove residual solvent and an electrode was subsequently attached to the conductive Au—Pd. A Digital Instrument Dimensions 3100 Atomic Force Microscope with a Nanoscope IIIa controller and nanolithography software was used. A highly conductive tungsten-carbide K-Tek cantilever tip was used and initially, tip-surface separation was adjusted in contact mode with a tip set-point such that no mechanical deformation of the surface occurred during image scanning. Application of input currents less than ~500 pA did not directly create features. As the applied voltage was increased, current abruptly increased (1-10 nA) and raised features were formed. It has been observed that feature dimensions increase proportionally to input current. Since the polymer is not removed or cross-linked during feature formation, heating the film above $T_g$ without an applied potential, such as with a hot plate, resulted in the removal of the pattern and creation of a featureless surface comparable to the initial film providing for erasure. Finally, for applied voltages generating currents greater than ~0.1 µA, depressions within the polymer resulted, forming holes at the center of the raised features and spreading outward with further current increase. For a wide-range of process conditions, biasing a voltage in the range of (0-20 Volts) utilizing a conductive tungsten-carbide tip across a polymer film having a thickness ~20-100 nm, surface roughness 0.5-1 nm, resting upon a sputter deposited Au—Pd film on a silicon wafer generated raised features (1-50 nm). Dots were formed by pausing 0.2-5 seconds with constant bias and lines were created at tip velocities from 0.1 µm/s to 8 µm/s.

Figure 1B:
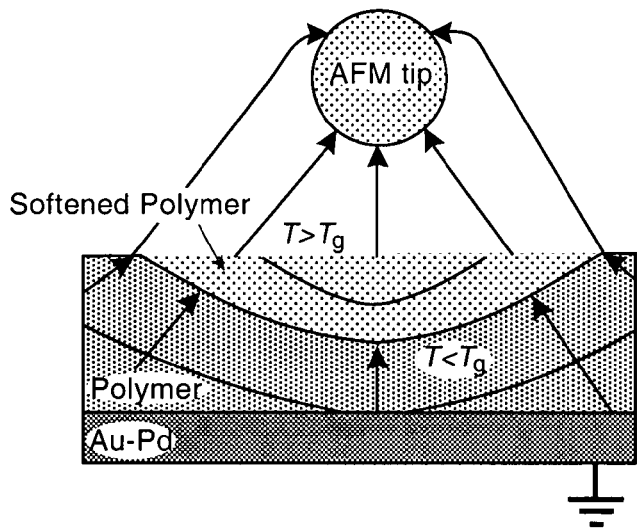
Figure 1C:
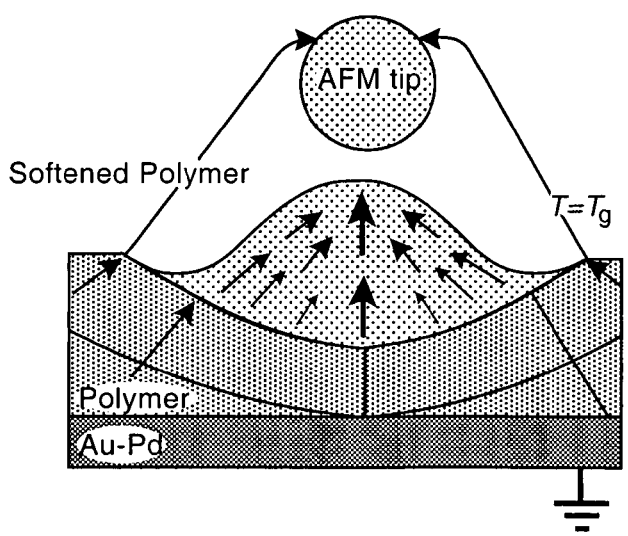

Attention is now directed to FIGS. 1a-1c. To provide additional insight into the processes underlying the method of the present invention, consider an idealized approximation of the initial writing geometry as a series of dielectric layers (air, polymer) between a conductive sphere (AFM cantilever tip) and conductive plane (Au—Pd layer). The geometrical details arising from the relative orientation of an AFM pyramidal tip with respect to the surface is, to a zero-order, subsumed into the spherical approximation of the tip. The electric field distribution inside the polymer film, estimated using the method of images, indicates that for moderate applied voltages (0-20V) at tip-surface separations of 1-5 nm, an enormously large electric field ($10^8$-$10^{10}$ V/m) exists directly under the AFM tip. Additionally, a very steep field gradient occurs in the immediate surrounding polymer where the electrostatic field decreases by a factor of 100-500 within a radius of the idealized AFM tip (R ~35 nm).

Conductivity, estimated from the Ohmic character of the i-V response assuming increased current flow occurs across an area comparable to the AFM tip diameter (2R=70 nm)) ranged from $10^4$-$10^{-2}$ $(\Omega m)^{-1}$ for polymethylmethacrylate (PMMA) and $5\times10^{-4}$-$2\times10^{-1}$ $(\Omega m)^{-1}$ for polystyrene (PS).

This is substantially greater than the conductivity for these polymers under moderate fields ($\sigma_{PMMA}$, 25° C.~$10^{-14}$ $(\Omega m)^{-1}$; $\sigma_{PS}$, 25° C.~$10^{-18}$ $(\Omega m)^{-1}$). It is believed that the flux of carriers may be generated due to water ionization inside a water meniscus around the AFM tip along with emission of electrons from the tip initiating dielectric breakdown in the polymer film. The extreme electric field estimated within the polymer is of the same order of magnitude as the intrinsic dielectric strength of many polymers ($10^9$ V/m for PMMA, $6 \times 10^8$ V/m for PS at 20° C.) creating conditions for the electric breakdown through the thin (20-100 nm) polymer films.

Current flow through the polymer film creates a stable, sustained temperature rise above the glass transition temperature, $T_g$ for a small fraction of the polymer under the AFM tip. This creates a localized region of a dielectric, viscoelastic 'liquid'. The large non-uniform electric field gradient surrounding the AFM tip will produce an electrostatic pressure, p(z), on this region of localized, polarizable softened polymer ($T > T_g$) of $$p(z) = \frac{\varepsilon_0(\varepsilon - 1)(\varepsilon + 2)}{6} E^2(z).$$

For representative fields ($E = 1$–$6 \times 10^9$ V/m) and polymer dielectric constant ($\varepsilon = 2.5$), pressures of 10-360 MPa are estimated; comparable to the shear modulus of polymer melts. The electrostatic pressure gradient, directed towards the AFM tip, leads to the raised feature formation. Estimating the feature formation process as a steady flow of a non-Newtonian incompressible liquid with a non-slip boundary, a 10-nm raised structure would form in 4.26 μsec. This is consistent with our own experimental observations of near instantaneous feature formation. Furthermore, feature formation should also be easier (faster and lower applied voltages) for lower molecular weight polymer, which exhibit lower $T_g$ and melt viscosity. This is again consistent with our experimentation where feature formation was more facile for 9.8K polystyrene relative to 110K polystyrene films.

In summary, numerous benefits have been described from utilizing the principles of the present invention. The nanolithography method of the present invention generates ternary features by mass transport of polymer within an initially uniform, planar film by localized softening of the polymer by Joule heating. This localized softening of the polymer can be readily manipulated to form raised or depressed features in less than one microsecond within the polymer film. The polymer itself is unaffected, enabling repetitive feature creation/erasure cycles, substantially without limitation on the number of cycles performed.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

The invention claimed is:

1. A polymer nanolithography method, comprising the steps of:
   providing an atomic force microscope;
   providing a conductive cantilever tip within said atomic force microscope;
   providing a thin polymer film mounted upon a conductive wafer;
   installing said thin polymer film within said atomic force microscope;
   establishing a relative humidity within said atomic force microscope between about 10 to about 70 percent;
   setting an initial tip-surface distance by applying a voltage to said cantilever tip such that no mechanical deformation of the surface of said polymer film during scanning occurs; and,
   forming nanoscale features upon said polymer by selectively varying said voltage applied to said cantilever tip to effect a desired localized softening of attoliters of said polymer by Joule heating.

2. The method of claim 1 further including the step of erasing said polymer by annealing at a temperature greater than $T_g$ for a sufficient time to remove said nanoscale features.

3. A polymer nanolithography method, comprising the steps of:
   providing an atomic force microscope;
   providing a highly conductive tungsten carbide cantilever tip within said atomic force microscope;
   growing a thin polymer film upon a conductive wafer;
   installing said thin polymer film within said atomic force microscope;
   establishing a relative humidity within said atomic force microscope between about 10 to about 70 percent;
   setting an initial tip-surface distance by applying a voltage to said cantilever tip such that no mechanical deformation of the surface of said polymer film during scanning occurs; and,
   forming nanoscale features upon said polymer by selectively varying said voltage applied to said cantilever tip to effect a desired localized softening of attoliters of said polymer by Joule heating.

4. The method of claim 3 further including the step of erasing said polymer by annealing at a temperature greater than $T_g$ for a sufficient time to remove said nanoscale features.

5. A polymer nanolithography method, comprising the steps of:
   providing an atomic force microscope;
   providing a conductive cantilever tip within said atomic force microscope;
   providing a thin polymer film mounted upon a conductive wafer;
   installing said thin polymer film within said atomic force microscope;
   establishing a relative humidity within said atomic force microscope between about 10 to about 70 percent;
   setting an initial tip-surface distance by applying a voltage to said cantilever tip such that no mechanical deformation of the surface of said polymer film during scanning occurs; and,
   forming nanoscale features upon said polymer by selectively varying said voltage applied to said cantilever tip to effect a desired localized softening of attoliters of said polymer by Joule heating, said voltage being varied to generate a first level of current in said polymer for forming raised features and a second, higher level of current for forming depressed features in said polymer.

6. The method of claim 5 further including the step of erasing said polymer by annealing said polymer at a temperature greater than $T_g$ for a sufficient time to remove said nanoscale features.

7. A polymer nanolithography method, comprising the steps of:

provensing an atomic force microscope;

providing a highly conductive tungsten carbide cantilever tip within said atomic force microscope;

growing a thin polymer film upon a conductive wafer;

installing said thin polymer film within said atomic force microscope;

establishing a relative humidity within said atomic force microscope between about 10 to about 70 percent;

setting an initial tip-surface distance by applying a voltage to said cantilever tip such that no mechanical deformation of the surface of said polymer film during scanning occurs; and, forming nanoscale features upon said polymer by selectively varying said voltage applied to said cantilever tip to effect a desired localized softening of attoliters of said polymer by Joule heating, said voltage being varied to generate a first level of current in said polymer for forming raised features and a second, higher level of current for forming depressed features in said polymer.

8. The method of claim 7 further including the step of erasing said polymer by annealing at a temperature greater than $T_g$ for a sufficient time to remove said nanoscale features.

* * * * *